US011161281B2

(12) United States Patent
Libsch et al.

(10) Patent No.: US 11,161,281 B2
(45) Date of Patent: Nov. 2, 2021

(54) STRUCTURE AND METHOD FOR MONITORING DIRECTED SELF-ASSEMBLY PATTERN FORMATION

(71) Applicant: International Business Machines Corporation, Armonk, NY (US)

(72) Inventors: Frank R. Libsch, White Plains, NY (US); Venkat K. Balagurusamy, Suffern, NY (US)

(73) Assignee: International Business Machines Corporation, Armonk, NY (US)

( * ) Notice: Subject to any disclaimer, the term of this patent is extended or adjusted under 35 U.S.C. 154(b) by 478 days.

(21) Appl. No.: 15/852,027

(22) Filed: Dec. 22, 2017

(65) Prior Publication Data

US 2019/0193308 A1     Jun. 27, 2019

(51) Int. Cl.
| | |
|---|---|
| *G01N 27/22* | (2006.01) |
| *B29C 39/44* | (2006.01) |
| *B29C 39/38* | (2006.01) |
| *G06F 3/044* | (2006.01) |
| *G03F 7/00* | (2006.01) |
| *H01L 27/01* | (2006.01) |
| *B82Y 40/00* | (2011.01) |

(52) U.S. Cl.
CPC ............. *B29C 39/44* (2013.01); *B29C 39/38* (2013.01); *B82Y 40/00* (2013.01); *G01N 27/226* (2013.01); *G03F 7/0002* (2013.01); *G06F 3/044* (2013.01); *H01L 27/01* (2013.01)

(58) Field of Classification Search
None
See application file for complete search history.

(56) References Cited

U.S. PATENT DOCUMENTS

| | | | |
|---|---|---|---|
| 5,270,664 A | 12/1993 | McMurtry et al. | |
| 5,567,637 A * | 10/1996 | Hirota | H01L 29/42324 257/E21.422 |

(Continued)

OTHER PUBLICATIONS

Tsai, et al., "High chi block copolymer DSA to improve pattern quality for FinFET device fabrication", Advances in Patterning Materials and Processes XXXIII, Proc. of SPIE, Mar. 25, 2016, pp. 977910-1 to 977910-7, vol. 9779.

(Continued)

*Primary Examiner* — Monica A Huson
*Assistant Examiner* — Kelsey C Grace
(74) *Attorney, Agent, or Firm* — Scully, Scott, Murphy & Presser, P.C.; Daniel P Morris, Esq.

(57) ABSTRACT

A capacitive sensor array for in-situ monitoring directed self-assembly of a self-assembling material is provided. The capacitive sensor array includes a bottom electrode plate including a plurality of bottom electrodes that are spaced apart and electrically isolated from one another, template structures located on the bottom electrode plate, wherein the template structures define trenches therebetween, each of the trenches exposing at least one of the plurality of bottom electrodes; and a top electrode plate assembled on the bottom electrode plate, wherein the top electrode plate includes a plurality of top electrodes that are spaced apart and electrically isolated from one another, the top electrodes facing and intersecting, but electrically isolated from, the bottom electrodes.

15 Claims, 10 Drawing Sheets

(56) References Cited

U.S. PATENT DOCUMENTS

| | | | |
|---|---|---|---|
| 5,583,359 A * | 12/1996 | Ng | H01L 23/5223 |
| | | | 257/306 |
| 6,317,508 B1 | 11/2001 | Kramer et al. | |
| 6,454,924 B2 | 9/2002 | Jedrzejewski et al. | |
| 7,217,562 B2 | 5/2007 | Cao et al. | |
| 8,321,174 B1 | 11/2012 | Moyal et al. | |
| 8,783,466 B2 | 7/2014 | Han et al. | |
| 8,856,693 B2 | 10/2014 | Cheng et al. | |
| 8,882,980 B2 | 11/2014 | Ling et al. | |
| 9,110,055 B2 | 8/2015 | Cai et al. | |
| 9,111,067 B2 | 8/2015 | Robles | |
| 9,310,363 B2 | 4/2016 | Shachar et al. | |
| 2005/0136419 A1 | 6/2005 | Lee | |
| 2008/0121045 A1 | 5/2008 | Cole et al. | |
| 2013/0242647 A1* | 9/2013 | Nakamura | G11C 11/14 |
| | | | 365/158 |
| 2015/0184235 A1* | 7/2015 | Reda | B01L 3/502715 |
| | | | 506/9 |
| 2016/0144405 A1 | 5/2016 | Astier et al. | |
| 2016/0178999 A1 | 6/2016 | Wuister et al. | |
| 2016/0350465 A1 | 12/2016 | Guillorn et al. | |

OTHER PUBLICATIONS

Ruiz, et al., "Line Roughness in Lamellae-Forming Block Copolymer Films", Macromolecules, Published: Jan. 27, 2017, pp. 1037-1046, 50.

Fühner et al., "An integrated source/mask/DSA optimization approach", Proc. SPIE, Mar. 23, 2016, 97800M-1 to 97800M-12, vol. 9780.

Wang C. et al., "Hydrodynamics of Diamond-Shaped Gradient Nanopillar Arrays for Effective DNA Translocation into Nanochannels", ACS Nano, Jan. 2015, pp. 1206-1218, 1206 9(2).

* cited by examiner

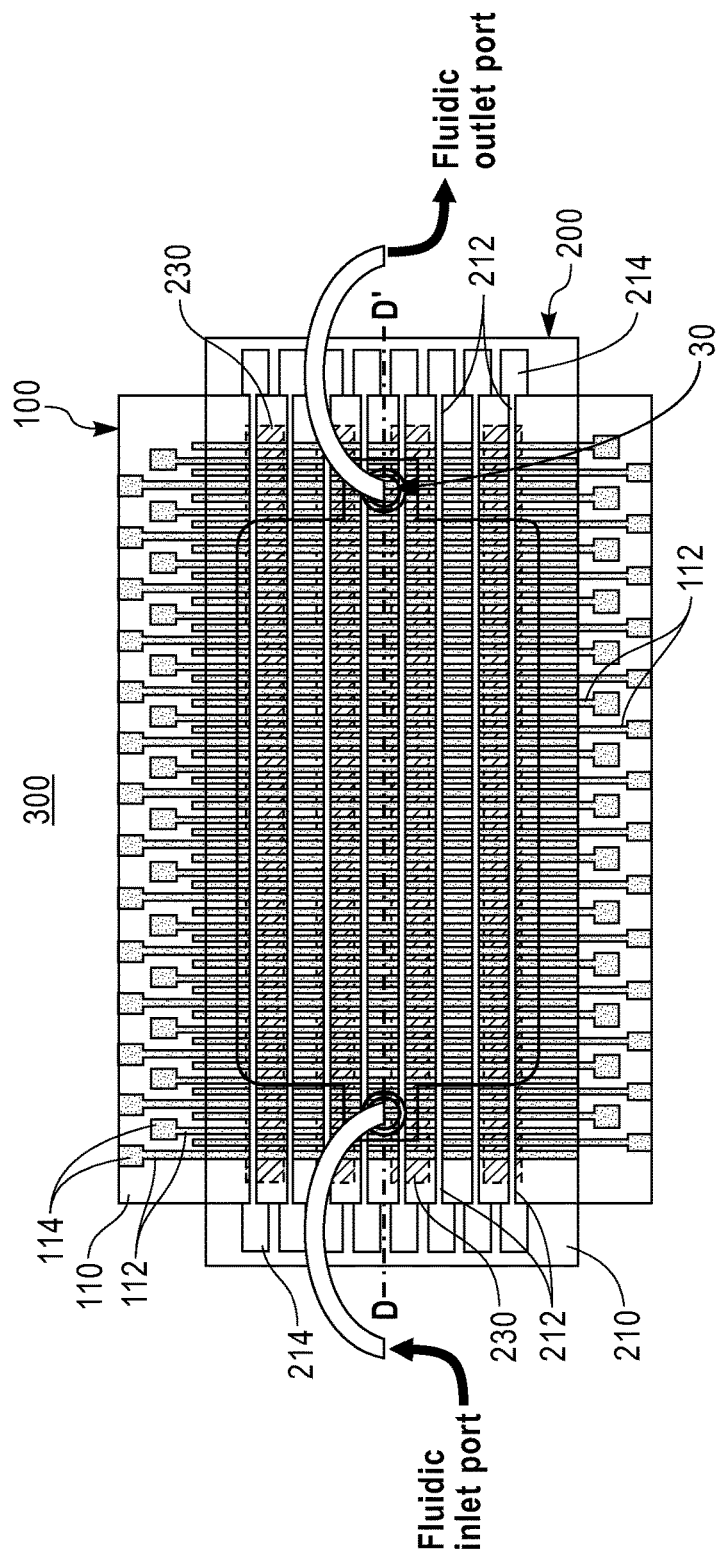
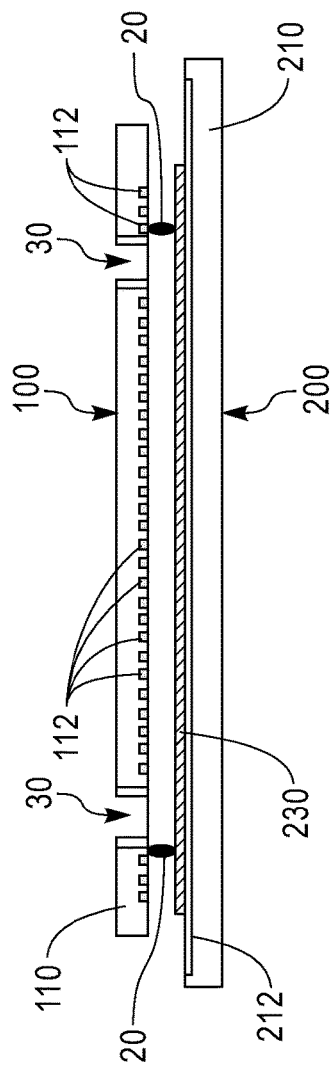
FIG. 4A
FIG. 4B

STRUCTURE AND METHOD FOR MONITORING DIRECTED SELF-ASSEMBLY PATTERN FORMATION

BACKGROUND

The present application relates to capacitive sensor arrays, and more particularly to capacitive sensor arrays for in-situ monitoring directed self-assembly (DSA) of a self-assembling material.

Directed self-assembly (DSA) of block copolymers through physically templating is an emerging patterning technology for generating narrow lines in integrated circuits with smaller pitches beyond the current optical lithographic limit. During the DSA process, block copolymers composed of chemically distinct polymer chains (i.e., blocks) that are covalently bonded at their ends self-assemble to form nanoscale structures, often with dimensions in the range of 5 nm to 50 nm, due to microphase separation of immiscible blocks. The DSA pattern generated from the block copolymers can be used as a mask for further pattern transfer into functional materials such as insulating, semiconducting, and/or conducting materials.

Liquid crystalline materials are widely used in displays, electro-optic and photonic devices and for energy conversion. This usefulness arises from the ability to control the self-organizing and self-assembling properties of the liquid crystalline materials.

One of the long-standing problems in the field of DSA of block copolymers is the inability to monitor the kinetics of DSA pattern formation in-situ. Likely, it is also very challenging to in-situ monitor the phase change and defect formation during the self-assembly of the liquid crystalline material. Therefore, there is a great need for structures and methods for in-situ monitoring, measuring and mapping DSA of block copolymers and liquid crystalline materials.

SUMMARY

The present application provides a capacitive sensor array for in-situ monitoring directed self-assembly of a self-assembling material.

In one aspect of the present application, a capacitive sensor array is provided. The capacitive sensor array includes a bottom electrode plate containing a plurality of bottom electrodes that are spaced apart and electrically isolated from one another. Template structures are located on the bottom electrode plate. The template structures define trenches therebetween with each of the trenches exposing at least one of the plurality of bottom electrodes. The capacitive sensor array also includes a top electrode plate assembled on the bottom electrode plate. The top electrode plate includes a plurality of top electrodes that are spaced apart and electrically isolated from one another. The top electrodes are arranged facing and intersecting, but electrically isolated from, the bottom electrodes.

In another aspect of the present application, a system for in-situ monitoring DSA of a self-assembling material is provided. The system includes a capacitive sensor array. The capacitive sensor array includes a bottom electrode plate containing a plurality of bottom electrodes that are spaced apart and electrically isolated from one another. Template structures are located on the bottom electrode plate. The template structures define trenches therebetween with each of the trenches exposing at least one of the plurality of bottom electrodes. The capacitive sensor array also includes a top electrode plate assembled on the bottom electrode plate. The top electrode plate includes a plurality of top electrodes that are spaced apart and electrically isolated from one another. The top electrodes are arranged facing and intersecting, but electrically isolated from, the bottom electrodes. An integrated sensing circuit is connected to the bottom electrodes and the top electrodes of the capacitive sensor array for performing a time sequence of capacitance measurements of one electrode pair relative to all the other electrode pairs. A processor is connected to the integrated sensing circuit for constructing a movement image of the DSA of the self-assembling material.

In yet another aspect of the present application, a method for in-situ monitoring directed self-assembly of a self-assembling material is provided. The method includes providing a capacitive sensor array. The capacitive sensor array includes a bottom electrode plate containing a plurality of bottom electrodes that are spaced apart and electrically isolated from one another. Template structures are located on the bottom electrode plate. The template structures define trenches therebetween with each of the trenches exposing at least one of the plurality of bottom electrodes. The capacitive sensor array also includes a top electrode plate assembled on the bottom electrode plate. The top electrode plate includes a plurality of top electrodes that are spaced apart and electrically isolated from one another. The top electrodes are arranged facing and intersecting, but electrically isolated from, the bottom electrodes. A solution of the self-assembling material is introduced into the trenches. Next, differential capacitances are measured between pairs of the plurality of bottom electrodes and the plurality of top electrodes.

BRIEF DESCRIPTION OF SEVERAL VIEWS OF THE DRAWINGS

FIG. 4A is a top view of an alternative embodiment of the first exemplary capacitive sensor array including an assembly of the first exemplary top electrode plate and the first exemplary bottom electrode plate spaced from each other by a gasket.

FIG. 4B is a cross-sectional view of the alternative embodiment of the first capacitive sensor array along line D-D'.

DETAILED DESCRIPTION

Figure 1A:
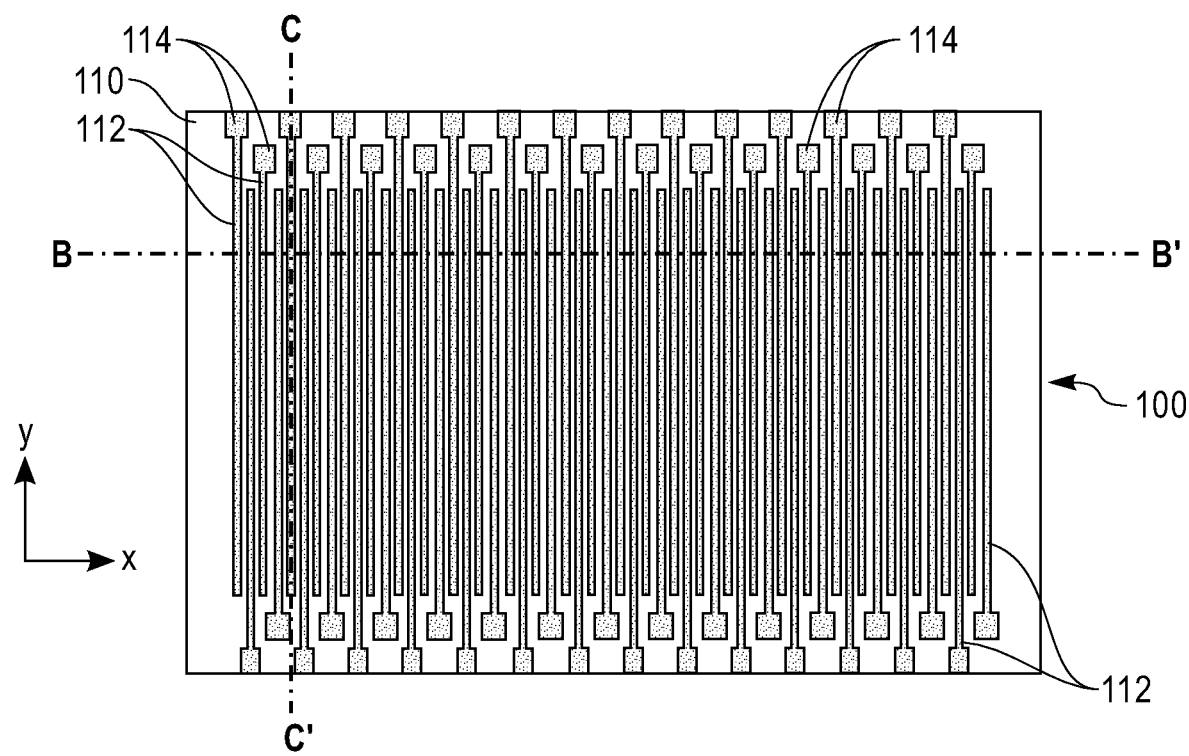
FIG. 1A is a top view of a first exemplary top electrode plate that can be employed according to a first embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1B:
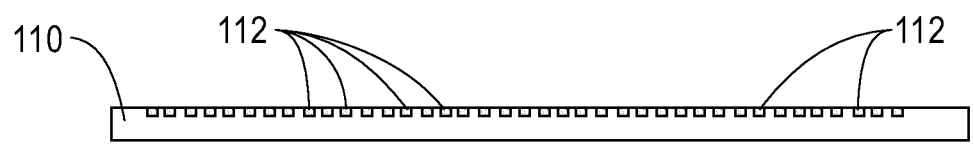
FIG. 1B is a cross-sectional view of the first exemplary top electrode plate along line B-B'.
Figure 1C:
FIG. 1C is a cross-sectional view of the first exemplary top electrode plate along line C-C'.

Referring to FIGS. 1A-1C, there are illustrated various views of a first exemplary top electrode plate 100 that can be employed according to a first embodiment of the present application. The first top electrode plate 100 includes a top substrate 110 and a plurality of top electrodes 112 formed on, or embedded within the top substrate 110. Each of the top electrodes 112 is terminated at one end by a top terminal pad 114. In one embodiment and as shown in FIG. 1A, the top terminal pads 114 are arranged such that a first set of the top terminal pads 114 connected to odd top electrodes 112 is located on a first end of the top substrate 110 and a second set of the top terminal pads 114 connect to even top electrodes 112 is located on a second end of the top substrate 110 opposite to the first end.

The top substrate 110 may be rigid or flexible and may include an insulating layer on a semiconductor material or an electrically insulating material such as, for example, glass or a polymer. Exemplary semiconductor materials that can be employed in the present application as the top substrate 110 include, but are not limited to, Si, Ge, SiGe, SiGeC, SiC, GaSb, GaP, GaN, GaAs, InAs, InP, AN, and all other III-V or II-VI compound semiconductors. In one embodiment, the top substrate 110 is comprised of silicon. Exemplary polymers that can be employed in the present application as the top substrate 110 include, but are not limited to, poly (ethylene terephthalate) (PET), poly(butylene terephthalate) (PBT), poly(enthylene naphthalate) (PEN), polycarbonate (PC), polyimides (PI), polysulfones (PSO), and poly(p-phenylene ether sulfone) (PES). In one embodiment, the top substrate 110 is comprised of a polyimide. Typically, the top substrate 110 is transparent and is composed of glass or a polymer.

The top substrate 110 that is employed in the present application may have a thickness from a few tens of microns to a few millimeters. In another embodiment, the top substrate 110 that is employed may have a thickness from a few microns to a few millimeters. The top substrate 110 can have other thicknesses that are above and/or below the ranges mentioned above.

The top electrodes 112 can be any number, size and/or shape. For example, the top electrodes 112 can be a plurality of conductive lines that are spaced apart and electrically isolated from each other. The conductive lines that provide the top electrodes 112 can be arranged in parallel or non-parallel. These conductive lines may have the same or different widths. In one embodiment, the width of the conductive lines can be from 1 nm to 1 cm. The conductive lines can also have other widths that are above and/or below the range mentioned above. The spacing between adjacent conductive lines may be the same or different. In one embodiment and as shown in FIG. 1A, the top electrodes 112 are a plurality of parallel conductive lines extending along a first direction. In one embodiment and as shown, the first direction is a vertical direction (herein referred to as "y direction").

In one embodiment, the top electrodes 112 and the top terminal pads 114 may be formed within the top substrate 110 by conventional lithography, etching and deposition processes. For example, a photoresist layer may first be formed on the top substrate 110 and exposed to light to form openings therein. An anisotropic etch such as, for example, a reactive ion etch (RIE), may then be performed to form trenches in the top substrate 110 using the patterned photoresist layer as an etch mask. The trenches can be filled with a conductive material such as, for example, gold, silver, nickel, copper, tungsten, aluminum or alloys thereof to provide the top electrodes 112 and the top terminal pads 114. The surface of the structure can be planarized using a planarization process such as, for example, chemical mechanical polishing (CMP). After planarization, the top surfaces of the top electrodes 112 and the top terminal pads 114 are coplanar with the top surface of the top substrate 110. This can be seen, for example, in FIG. 1B.

In another embodiment, the top electrodes 112 and the top terminal pads 114 may be formed on the top substrate 110 by blanket depositing a conductive material followed by lithographically etching the conductive material. For example, a conductive material may be first blanket deposited on the top substrate 110 using a conventional deposition process such as, for example, chemical vapor deposition (CVD), physical vapor deposition (PVD), plasma-enhanced vapor deposition (PECVD), or atomic layer deposition (ALD). A photoresist layer may then be formed on the conductive material, and exposed to light to form openings therein. The exposed conductive material may then be removed using RIE, through the openings, to form the top electrodes 112 and the top terminal pads 114 using the patterned photoresist layer as an etch mask. Subsequently, the patterned photoresist layer may be removed, for example, by ashing. The top surfaces of the top electrodes 112 and the top terminal pads 114 are thus located above the top surface of the top substrate 110.

In yet another embodiment, the top electrodes 112 and the top terminal pads 114 may be formed on the top substrate 110 by blanket depositing a metal seed layer and lithographically etching the metal seed layer form metal seed regions (not shown) in areas where the top electrodes 112 and the top terminal pads 114 are to be formed, followed by metal plating of a conductive material on the metal seed regions. The top surfaces of the top electrodes 112 and the top terminal pads 114 are thus located above the top surface of the top substrate 110.

In instances where the top electrodes 112 and the top terminal pads 114 are formed on top of the top substrate 110, after formation of the top electrodes 112 and the top terminal pads 114, an insulator layer may be deposited on top of the top substrate 110 to embed the top electrodes 112 and the top terminal pads 114 therein. The insulator layer may include a dielectric material such as, for example, silicon dioxide, silicon nitride, or a low dielectric constant (low-k) material such as organosilicate glass; the term "low-k denotes a dielectric material having a dielectric constant of less than silicon dioxide. The insulator layer can be formed, for example, by CVD, PECVD or spin coating. The insulator layer is optional and can be omitted in some embodiments of the present application.

Figure 2A:
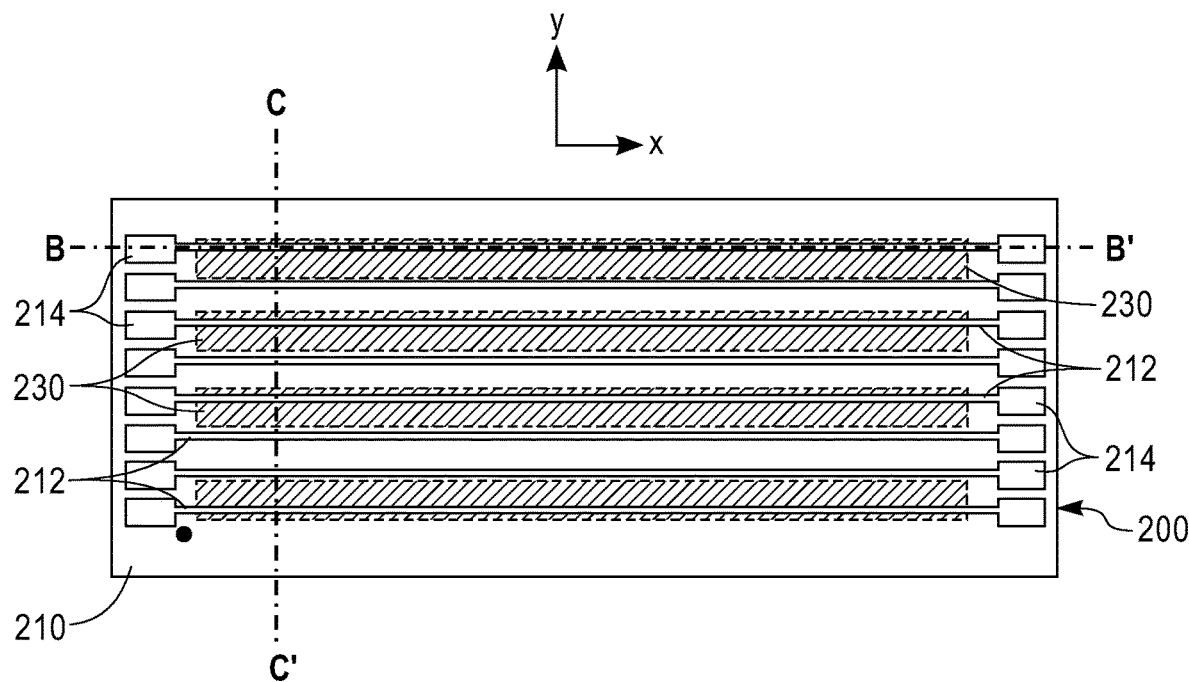
FIG. 2A is a top view of a first exemplary bottom electrode plate that can be employed according to the first embodiment of the present application.
Figure 2B:
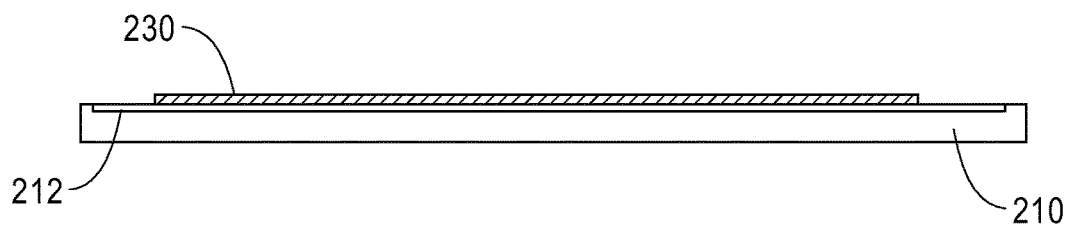
FIG. 2B is a cross-sectional view of the first exemplary bottom electrode plate along line B-B'.
Figure 2C:
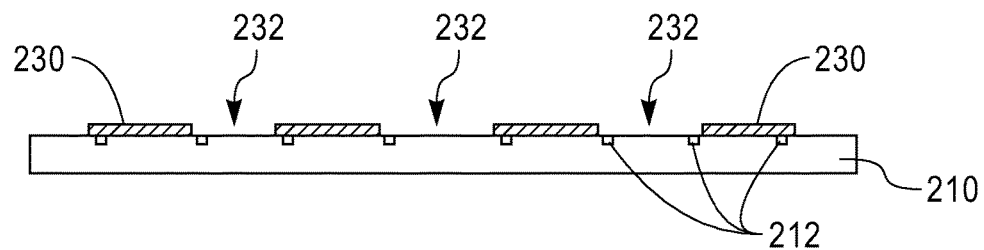
FIG. 2C is a cross-sectional view of the first exemplary bottom electrode plate along line C-C'.

Referring to FIGS. 2A-2C, there are illustrated various views of a first exemplary bottom electrode plate 200 that can be employed according to the first embodiment of the present application. The bottom electrode plate 200 includes a bottom substrate 210 and a plurality of bottom electrodes 212 formed on, or embedded within, the bottom substrate 210. Each of the bottom electrodes 212 is terminated at opposite ends by bottom terminal pads 214.

The bottom substrate 210 may be rigid or flexible and may include a material the same as, or different from, the material that provides the top substrate 110. In one embodiment, the bottom substrate 210 is transparent and is composed of glass or a polymer. Using transparent substrates may add an additional advantage of visible viewability of changes occurring between the substrates.

The bottom electrodes 212 can be any number, size and/or shape. For example, the bottom electrodes 212 can be a plurality of conductive lines that are spaced apart and electrically isolated from each other. The conductive lines that provide the bottom electrodes 212 can be arranged in parallel or non-parallel. These conductive lines may have the same or different widths. In one embodiment, the width of the conductive lines can be from 1 nm to 1 cm. The conductive lines can also have other widths that are above and/or below the range mentioned above. The spacing between adjacent conductive lines may be the same or different. In one embodiment and as shown in FIG. 2A, the bottom electrodes 212 are a plurality of parallel conductive lines extending along a second direction that is different from the first direction. In one embodiment, the first direction and the second direction may be substantially perpendicular to each other, for example, the first direction is the vertical direction and the second direction is the horizontal direction (herein referred to as "x direction"). In other variant embodiments, the first direction and the second direction may be non-perpendicular to each other.

The bottom electrodes 212 and the bottom terminal pads 214 can be formed on top of, or embedded within, the bottom substrate 210, by processing steps described above in formation of the top electrodes 112. An optional insulator layer may be formed laterally surrounding the bottom electrodes 212 and the bottom terminal pads 214 if bottom electrodes 212 and bottom terminal pads 214 are located on top of the bottom substrate 210.

Deposited on the bottom electrodes plate 200 are a plurality of template structures 230 for guiding or confining the self-assembly of a self-assembling material to be measured. The self-assembling material may include a diblock copolymer, a triblock copolymer, a blend of homopolymers, a blend of copolymers, or a liquid crystalline material. In one embodiment, the DSA material is a diblock copolymer. Suitable diblock copolymers include, but are not limited to, polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA). In one embodiment, the self-assembling material is a diblock copolymer of PS and PMMA.

The template structures 230 may be formed by depositing a blanket template material layer (not shown) on the bottom substrate 210, the bottom electrodes 212 and the bottom terminal pads 214, applying a photoresist layer thereupon, lithographically patterning the photoresist layer, and transferring the pattern of the photoresist layer into the blanket template material layer. After forming the template structures 230, the patterned photoresist layer can be removed selective to the template, for example, by ashing. It should be noted that other methods known in the art, such as sidewall image transfer (SIT) or DSA, can also be used to pattern the template material layer to provide the template structures 230.

The template material may be selected such that the template structures 230 can be preferentially wetted by one type of the self-assembling material domain (for example, A domains of an A-B diblock copolymer) to induce or confine the alignment of a phase separated self-assembling material. For example, the template structures 230 may include hydrogen silsesquioxane (HSQ) or methyl silsesquioxane (MSQ). Further, the template structures 230 may be treated by known methods to adjust the wetting properties with respect to the DSA material. For example, the surfaces of the template structures 230 may be treated by depositing or grafting a suitable material that affects surface hydrophilicity or hydrophobicity of the template structures 230.

Each of the template structures 230 that is formed may have a rectangular shape in cross-section. In one embodiment, the template structures 230 may have the same width and may be periodically spaced. In another embodiment, the template structures 230 may have different widths and may be non-periodically spaced. The width of the template structures 230 is typically greater than a minimum feature size that may be formed using a specific lithographic technique. In one embodiment, the width of each of the template structures 230 is from 80 nm to 180 nm, although lesser and greater widths can also be employed. The spacing between adjacent template structures 230 is a set to be an integer multiple of the natural period of the self-assembling material to avoid introducing defects within the DSA pattern. In one embodiment, the spacing between adjacent template structures 230 can be from 50 nm to 200 nm, although lesser and greater spacings can also be employed.

The template structures 230 define trenches 232 within which the self-assembly of the self-assembling material occurs. Each of the trenches 232 may expose at least one bottom electrodes 212. In some embodiments, some of the bottom electrodes 212 remain covered by the template structures 230.

The relative positions of the bottom electrodes 212 and the template structures 230 can vary. For example, the bottom electrodes 212 can be placed such that those bottom electrodes 212 that are not covered by the template structures 230 are located at different distances from adjacent template structures 230, so as to cover maximum number of DSA pattern variances.

Figure 3A:
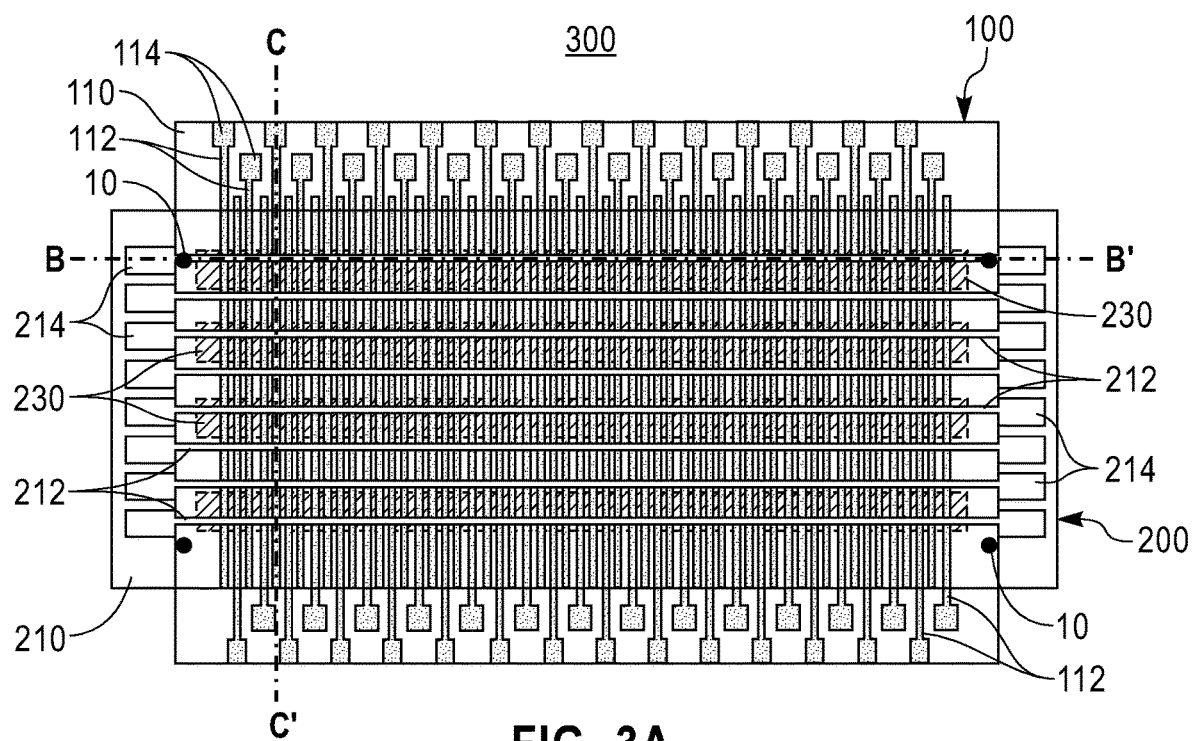
FIG. 3A is a top view of a first exemplary capacitive sensor array including an assembly of the first exemplary top electrode plate and the first exemplary bottom electrode plate spaced from each other by spacers.
Figure 3B:
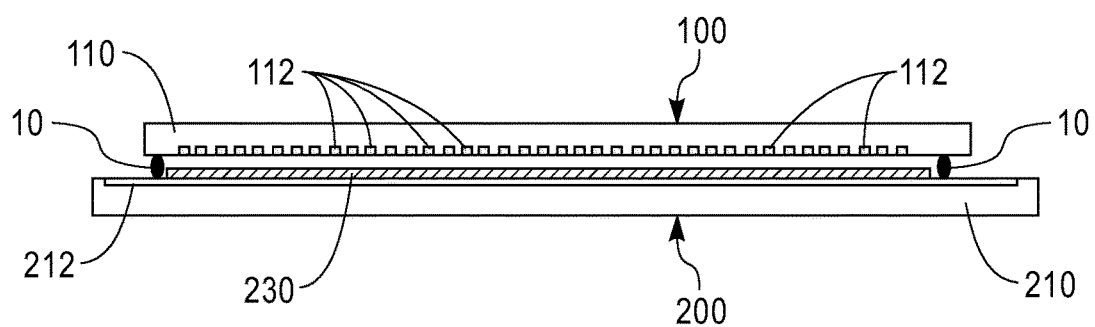
FIG. 3B is a cross-sectional view of the first exemplary capacitive sensor array along line B-B'.
Figure 3C:
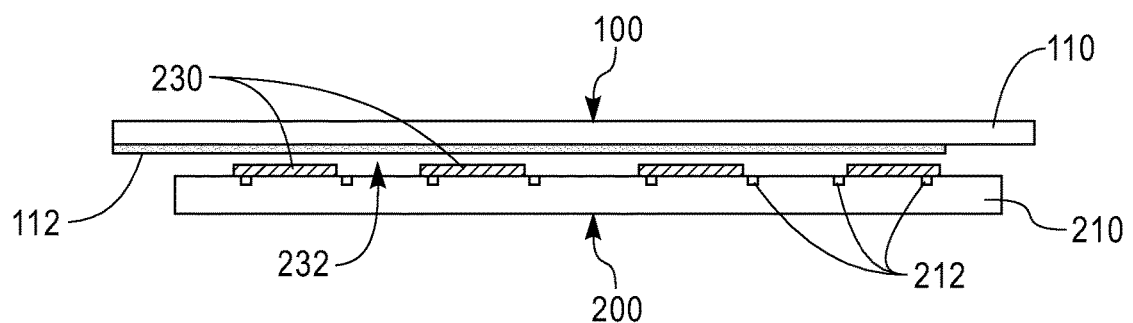
FIG. 3C is a cross-sectional view of the first exemplary capacitive sensor array along line C-C'.

Referring to FIGS. 3A-3C, there are illustrated various views of a first exemplary capacitive sensor array 300 according to the first embodiment of the present application. The first exemplary capacitive sensor array 300 can be formed by assembling the top electrode plate 100 over the bottom electrode plate 200 with the top electrodes 112 and the bottom electrodes 212 facing each other. The top electrodes 112 and the bottom electrodes 212 intersect, forming a plurality of micro-capacitance units. The relative dimensions of the top substrate 110 and the bottom substrate 210 are selected such that the top terminal pads 114 are located beyond the edges of the bottom substrate 210 along the y direction, which means that the top terminal pads 114 are not covered by the bottom substrate 210, while the bottom terminal pads 214 are located beyond the edges of the top substrate 110 along the x-direction, which means that the bottom terminal pads 214 are not covered by the top substrate 110.

The top electrode plate 100 is spaced away from the bottom electrode plate 200 by a plurality of spacers 10. The spacers 10 set the distance between the top electrode plate 100 and the bottom electrode plate 200. The height of the spacers 10 can be adjusted to obtain the best measurement resolution. The height of the spacers 10 can be from 1 nm to 1 cm.

The spacers 10 can be disposed around the periphery of one of the top electrode plate 100 and the bottom electrode plate 200. It should be noted that although four spacers 10 are illustrated in FIG. 3A, additional spacers 10 may also be used for increased mounting stability of the top electrode plate 100. The spacers 10 can be deposited on one of the electrode plates 100, 200 before the top electrode plate 100 and the bottom electrode plate 200 are assembled.

Spacers 10 are typically made from a rigid material having a high tensile strength. In one embodiment, the spacers 10 may be made of a ceramic. Exemplary ceramics include, but are not limited to, $TiO_2$, $Ta_2O_5$, $BaTiO_3$, $SrTiO_3$, $PbZrTiO_3$, $LiNbO_3$, $PbMgTiO_3$, and $PbMgNbO_3$. In another embodiment, the spacers 10 may be made of a polymer. Exemplary polymers include, but are not limited to, epoxies, polyimides, polyurethanes, parylene, polysulfones, polysulfides, benzylcyclobutenes (BCBs), nylons, polyvinylidene fluoride (PVDF), and phenolic. In yet another embodiment, the spacers 10 may be made of insulators commonly used in microelectronic fabrication such as, for example, various oxides or nitrides, or are made of conductors that are insulated coated such as, for example copper or aluminum passivated by oxide or nitride layers.

Referring to FIGS. 4A and 4B, there are illustrated various views of an alternative embodiment of the first exemplary capacitive sensor array 300, wherein the spacers 10 are provided as a ring (herein referred to as gasket 20). The gasket 20 is formed along the periphery of the bottom substrate 210, separating the top electrode plate 100 and the bottom electrode plate 200 and enclosing trenches 232 therein.

The gasket 20 can be formed by methods known in the art. In one embodiment, the gasket 20 may be formed from mirror twins of a solder material with a first gasket (not shown) formed on one of the top electrode plate 100 and the bottom electrode plate 200 and a second gasket (not shown) formed on another one of the top electrode plate 100 and the bottom electrode plate 200. Exemplary solder materials that can be employed in the present application include, but are not limited to, tin/copper, tin/silver (which high concentration of silver), tin/gold, SAC (tin with small percentages of aluminum and copper), and nickel with SAC. During the assembly process, once the first gasket and the second gasket are mated, the solder material is reflowed to provide the gasket 20. In another embodiment, the gasket 20 may be formed via mechanical interlock. For example, a double hump-shaped gasket (not shown) may be formed on one of the top electrode plate 100 and the bottom electrode plate 200, and a single hump-shaped gasket may be formed on one of the top electrode plate 100 and the bottom electrode plate 200. Upon mating, the double hump-shaped gasket is forced to straddle and lock onto the single hump-shaped gasket by applying tension to the double hump-shaped gasket, thereby boding the top electrode plate 100 and the bottom electrode pate 200. In yet another embodiment, the gasket 20 may be simply provided by forming an epoxy gasket on the bottom electrode plate 200.

The gasket 20 may also be used to assure fluid containment within the trenches 232 after a DSC material solution is introduced into trenches 232. In some embodiments and as shown, the top electrode plate 100 may also include one or more through holes 30 through which the DSC material solution can be introduced into trenches 232. For example, two through holes 30 are formed at opposite ends of the top electrode plate 100 with one being a fluidic inlet port and the other one being a fluidic outlet port. In another embodiment, the one or more through holes 30 can all serve as fluidic inlet port. The through holes 30 may be formed through the top substrate 110 by any method know in the art such as, for example, laser drilling or mechanical drilling.

Figure 5A:
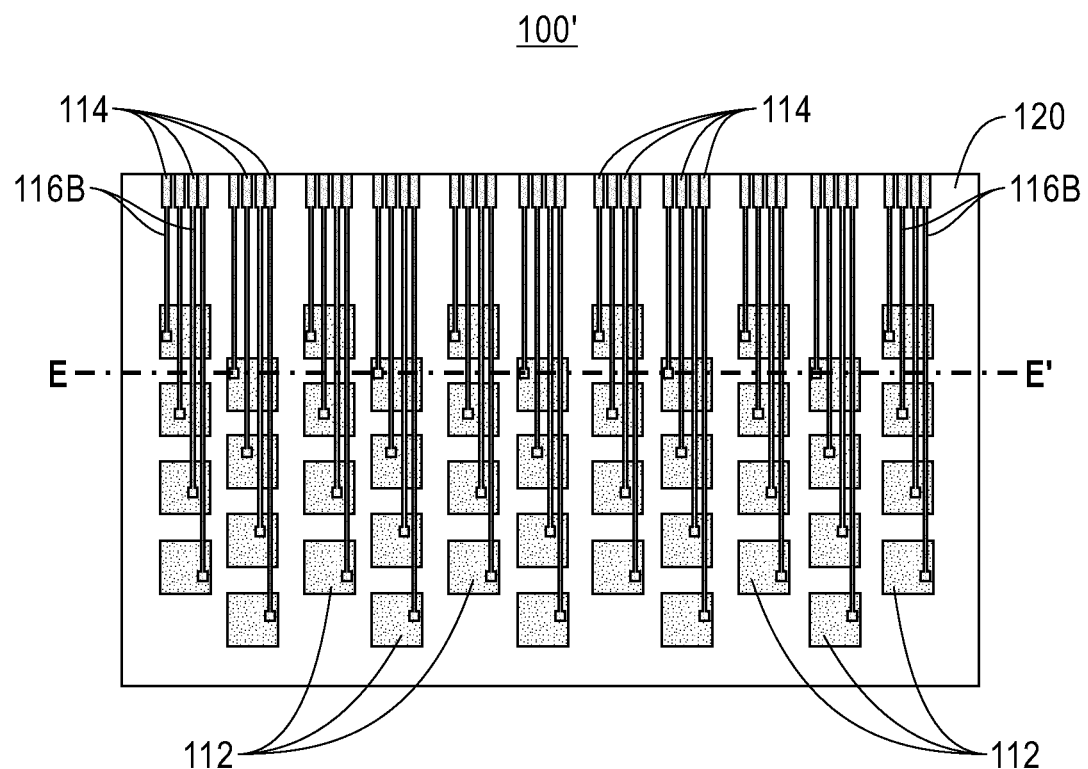
FIG. 5A is a second exemplary top electrode plate that can be employed according to a second embodiment of the present application.
Figure 5B:
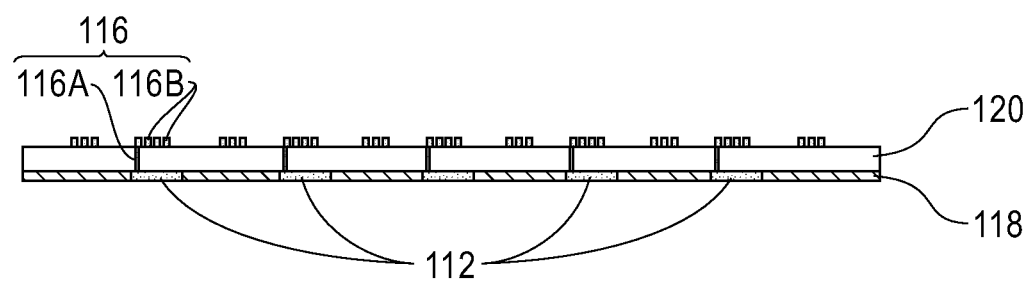
FIG. 5B is a cross-sectional view of the second exemplary top electrode plate along line E-E'.

Referring to FIGS. 5A and 5B, there are illustrated various views of a second exemplary top electrode plate 100' that can be employed according to the second embodiment of the present application. The top electrode plate 100' includes a plurality of top electrodes 112 surrounded by a passivation layer 118. Each of the top electrodes 112 is electrically connected to a top terminal pad 114 via a connection structure 116. In this case, the passivation layer 118 constitutes the top substrate for the top electrode plate 100'.

In the second embodiment and as shown in FIG. 5A, the top electrodes 112 are a plurality of conductive pads that are spaced part from each other, with each of the conductive pads being polygonal in shape. The top electrodes 112 may be formed on top of a sacrificial substrate (not shown) using methods described above in formation of the top electrode 112 of FIGS. 1A-1C. Subsequently, a dielectric material is deposited on the top substrate and the top electrodes 112 and planarized to provide the passivation dielectric layer 118. The passivation layer 118 may include a dielectric oxide such as, for example, silicon dioxide or a dielectric nitride such as, for example, silicon nitride. The dielectric material that provides the passivation layer 118 can be deposited, for example, by CVD, PECVD or PVD.

Each of the interconnect structures 116 may include an interconnect via 116A and an interconnect trace 116B that electrically connects the interconnect via 116A to a corresponding top terminal pad 114. In one embodiment, the interconnect structures 116 and top terminal pads 114 can be formed by first depositing an insulator layer 120 over the top electrodes 112 and the passivation layer 118 and then etching the insulator layer 120 to form via openings (not shown). The insulator layer 120 may include a dielectric material the same as, or different from, the dielectric material that provides the passivation layer 118. A conductive material such as, for example, copper, tungsten, aluminum or alloys thereof can then be deposited to fill the via openings. After excess metal on top of the insulator layer 120 is removed, for example, by CMP, as shown in FIG. 5B, a plurality of interconnect vias 116A is thus formed in the via openings. Subsequently, a conductive material layer (not shown) is blanket deposited on top of the insulator layer 120 and the interconnect vias 116A using, for example, CVD or PVD, and lithographically patterned to form the interconnect traces 116B and the top terminal pads 114. Exemplary conductive materials that can be used in the interconnect traces 116B and the top terminal pads 114 include, but are not limited to, copper, tungsten, aluminum and alloys thereof. It should be noted that the interconnect traces 116B and the top terminal pads 114 may also be formed by a screen printing or stencil printing technique of a suitable conductive paste material. In this case, the top surfaces of the interconnect trances 116B and the top terminal pads 114 are located above the top surface of the insulator layer 120.

In another embodiment, after formation of the insulator layer 120, the interconnect structure 116 and the top terminal pads 114 may be formed by a dual damascene process known in the art. In this case, the top surfaces of the interconnect trances 116B and the top terminal pads 114 are coplanar with the top surface of the insulator layer 120.

After formation of the interconnect structures 116 and the top terminal pads 114, the sacrificial substrate can be removed to expose the top electrodes 112 from bottom sides thereof.

Figure 6A:
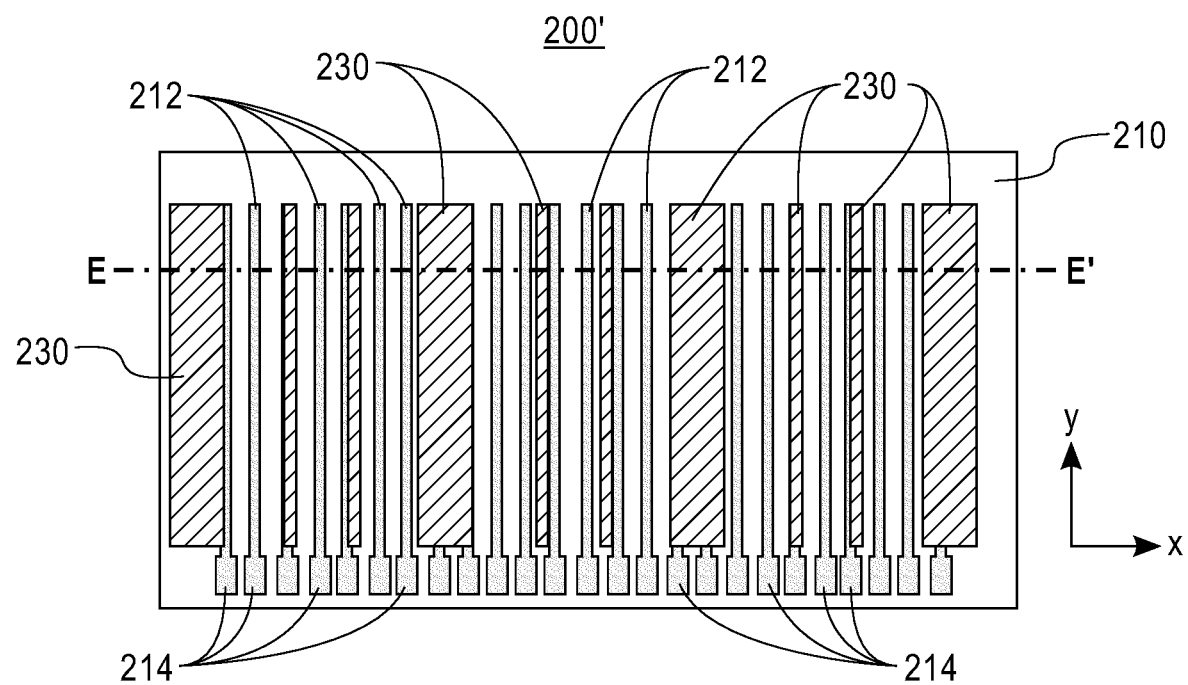
FIG. 6A is a top view of a second exemplary bottom electrode plate that can be employed according to the second embodiment of the present application.
Figure 6B:
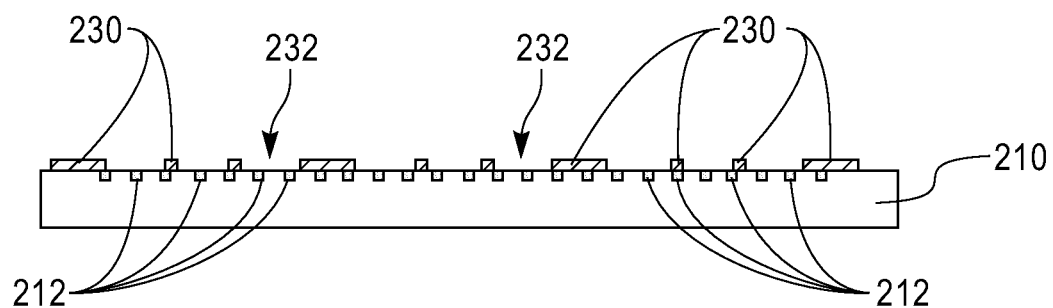
FIG. 6B is a cross-sectional view of the second exemplary bottom electrode plate along line E-E'.

Referring to FIGS. 6A and 6B, there are illustrated various views of a second exemplary bottom electrode plate 200' that can be employed according to a second embodiment of the present application. The bottom electrode plate 200' includes a bottom substrate 210 and a plurality of bottom electrodes 212 formed on, or embedded within, the bottom substrate 210. Each of the bottom electrodes 212 is electrically connected to a bottom terminal pad 214 at one end.

The bottom substrate 210 may be rigid or flexible and may include any material described above in FIGS. 2A-2C.

The bottom electrodes 212 can be any number, size and/or shape. In one embodiment and as shown in FIG. 6A, the bottom electrodes 212 are a plurality of conductive lines that are spaced apart for each other. The conductive lines that provide the bottom electrodes 212 can be arranged in parallel or non-parallel. The width of these conductive lines and spacing between adjacent conductive lines may be the same or different. The bottom electrodes 212 and the bottom terminal pads 214 can be formed on top of, or embedded within, the bottom substrate 210, by processing steps described above in FIGS. 2A-2B.

Deposited on the bottom electrode plate 200' are template structures 230 for guiding or confining the DSA of a self-assembling material to be measured. In the second embodiment and as shown in FIG. 6A, each of the template structures 230 has a rectangular shape in cross-section, and the width of the template structures 230 and the spacing between adjacent template structures 230 are different. The trenches 232 defined by the template structures 230 exposes at least one bottom electrodes 212.

Figure 7A:
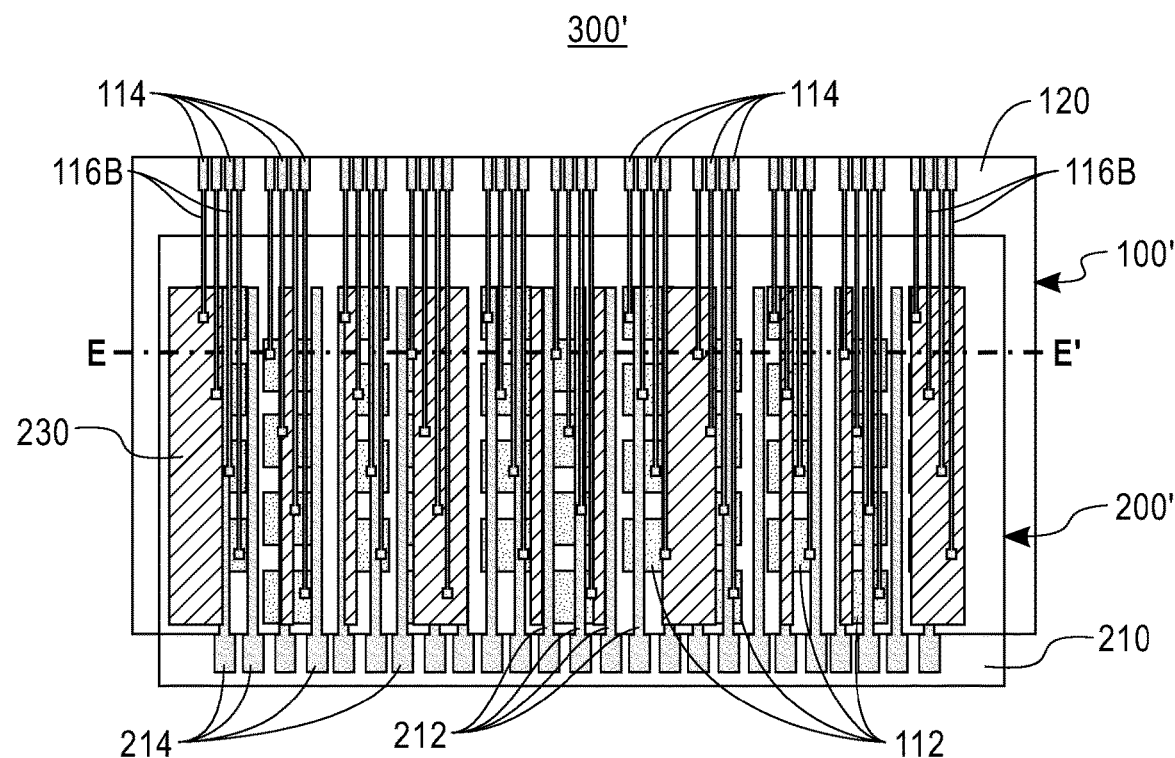
FIG. 7A is a top view of a second exemplary capacitive sensor array including an assembly of the second exemplary top electrode plate and the second exemplary bottom electrode plate spaced from each other.
Figure 7B:
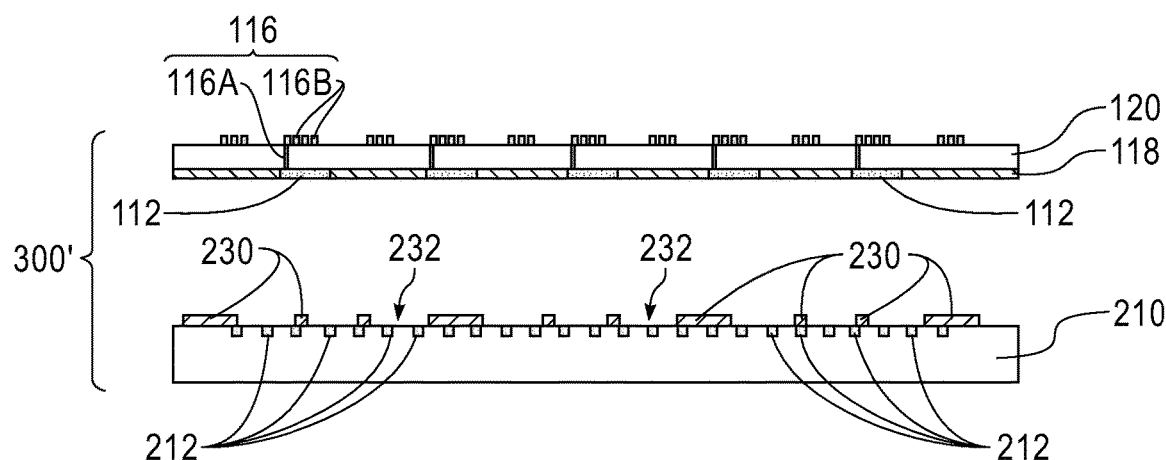
FIG. 7B is a cross-sectional view of the second exemplary capacitive sensor array along line E-E'.

Referring to FIGS. 7A and 7B, there are illustrated various views of a second exemplary capacitive sensor array 300' according to the second embodiment of the present application. The second exemplary capacitive sensor array 300' can be formed by imposing the top electrode plate 100' as described above in FIGS. 5A and 5B over the bottom electrode plate 200' as described above in FIGS. 6A and 6B, with the top electrodes 112 and the bottom electrodes 212 facing each other. The top electrodes 112 and the bottom electrodes 212 intersect, forming a plurality of micro-capacitance units. The top terminal pads 114 are located beyond edges of the bottom electrode plate 200', while the bottom terminal pads 214 are located beyond edges of the top electrode plate 100' for electrical connection. The top electrode plate 100' and the bottom electrode plate 200' can be spaced from each other by spacers (not shown) as described above in FIGS. 3A-3C or a gasket (not shown) as described above in FIGS. 4A-4C.

Figure 8:
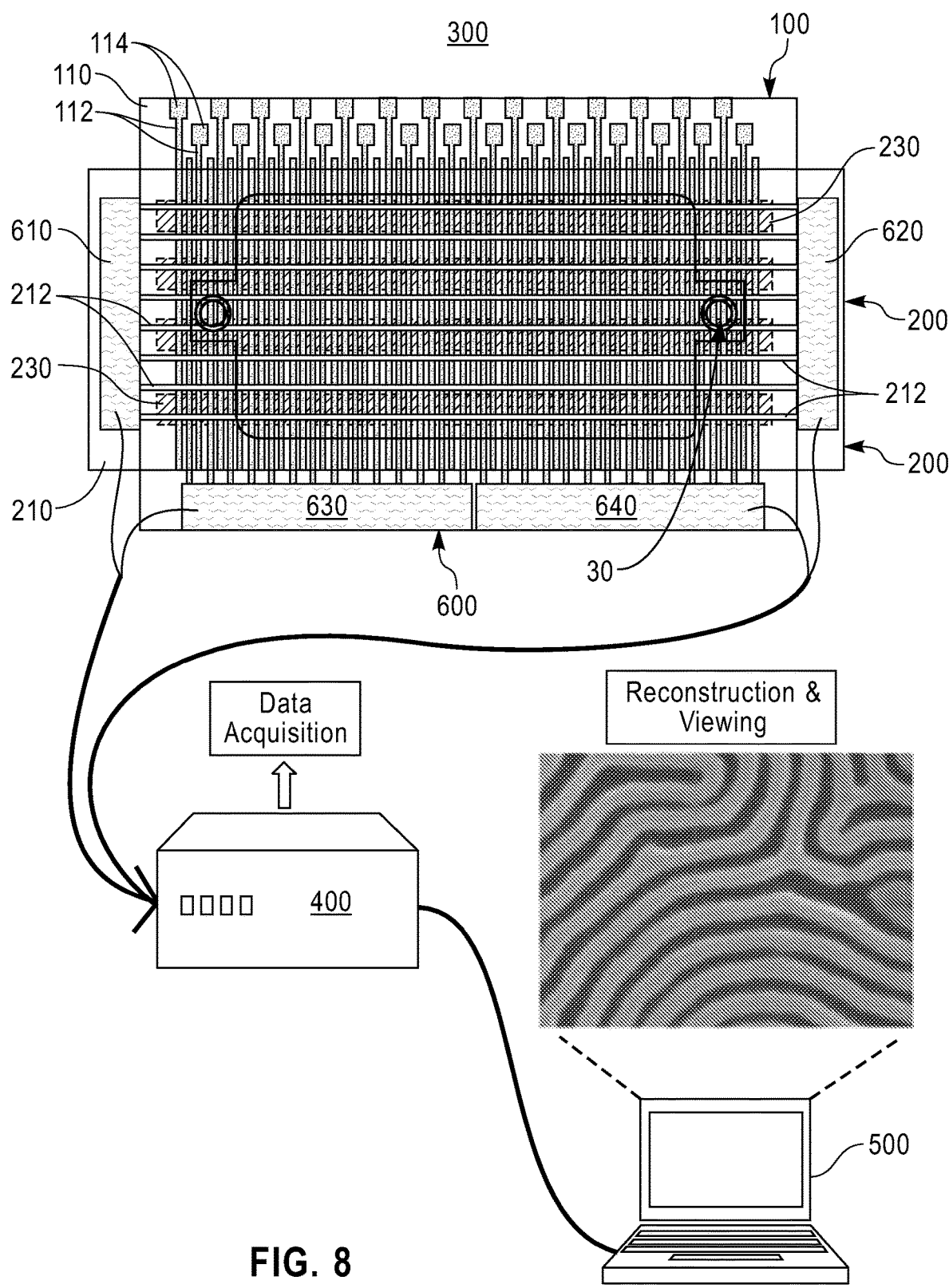
FIG. 8 is a system for monitoring DSA of a self-assembling material according to an embodiment of the present application.

Referring to FIG. 8, a system for monitoring DSA pattern formation of a self-assembling material according to an embodiment of the present application is illustrated. The system includes a first exemplary capacitive sensor array 300 as illustrated in FIGS. 4A-4C, a data acquisition unit 400 connected to the capacitive sensor array 300 for data acquisition and a processor 500 connected to the data acquisition unit 400 for data processing.

In one embodiment and as shown in FIG. 8, the data acquisition unit 400 is connected to the top electrodes 112 and the bottom electrodes 212 through an integrated sensing circuit 600. The integrated sensing circuit 600 is capable of performing a time sequence of capacitance measurements to one electrode relative to all the other electrodes. The integrated sensing circuit 600 typically includes a plurality of subcircuits that are bonded to the top and bottom terminal pads 114, 214 through I/O pins. The top electrodes 112 and the bottom electrodes 212 can thus be grouped in different fashions through the subcircuits. When measuring the capacitance, the integrated sensing circuit 600 can provide an alternating current (AC) excitation or a direct current (DC) excitation. The DC excitation may include a path to ground (GND). The integrated sensing circuit 600 allows connecting top electrodes 112 and bottom electrodes 212 with fewer leads, thus can improve signal-to-noise ratio, reduce the number of inputs/outputs and eliminate the need of using external circuitry for performing the same function.

In one embodiment and as shown in FIG. 8, the integrated sensing circuit 600 includes a first subcircuit 610 bonded to a first set of bottom terminal pads 214 located at first ends of the bottom electrodes 212, a second subcircuit 620 bonded to a second set of bottom terminal pads 214 located at second ends of the bottom electrode 212 that is opposite from the first ends, a third subcircuit 630 and a fourth subcircuit 640 bonded to a first set of the top terminal pads 112 located at first ends of the top electrodes 112. Such an arrangement allows independently acquiring signals from the third subcircuit 630 and the fourth subcircuit 640, which provides great flexibility in data acquisition. In this case, and since the integrated sensing circuit 600 only connects to the even top electrodes 112, the number of independent capacitance measurements available is ½ of total number of top electrodes 112. The odd top electrode 1112 can be grounded, serving as a guard band.

Figure 9:
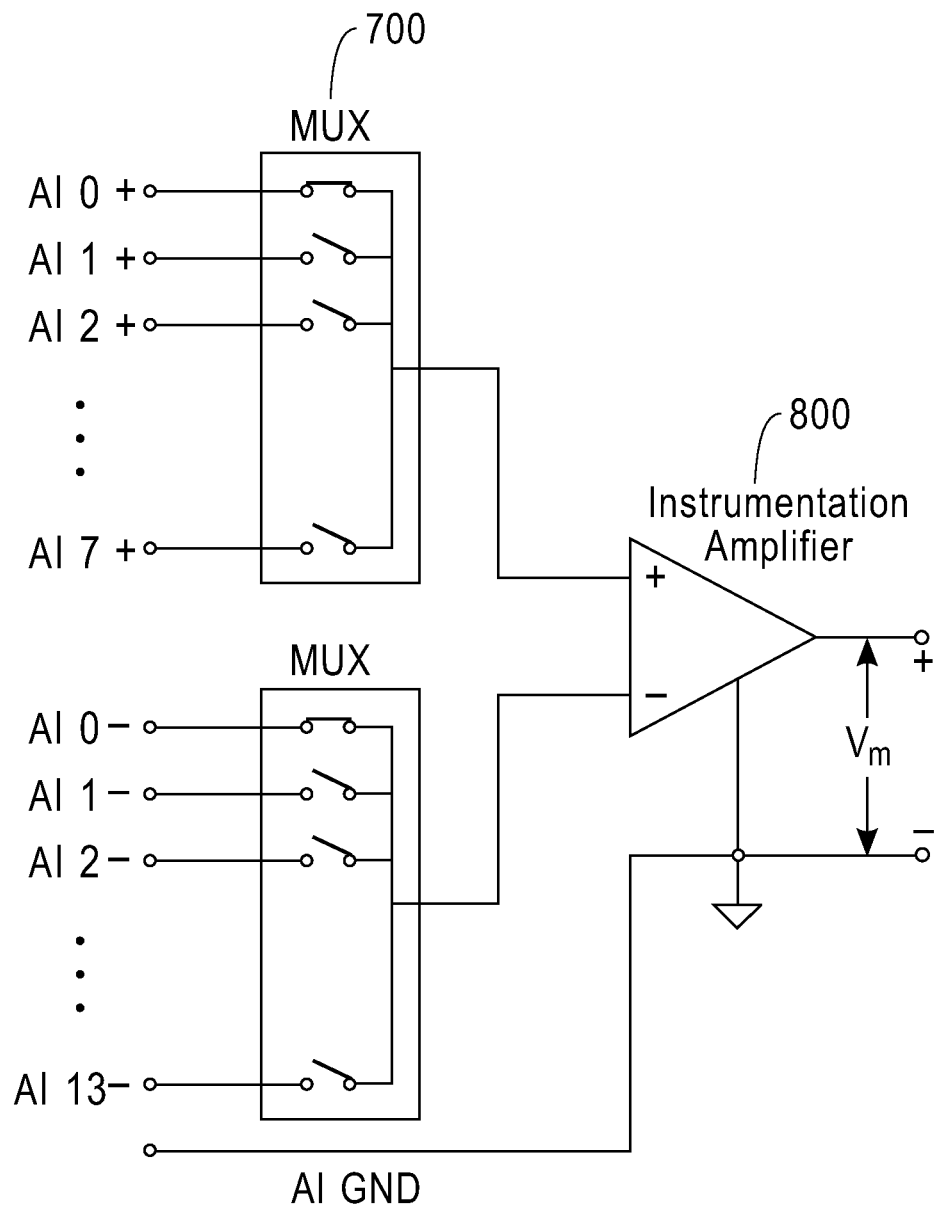
FIG. 9 is a circuit diagram of subcircuits employed in an integrated sensing circuit in the system of FIG. 8.

As shown in FIG. 9, each subcircuit 610, 620, 630, 640 includes a pair of multiplexers (mux) 700 coupled to an instrumentation amplifier 800. In one embodiment, the instrumentation amplifier 800 may be a capacitance sense amplifier for AC or DC differential capacitance sensing or a two-lead (+/−) or a three-lead (+/−/GND) hook-up. In another embodiment, the instrumentation amplifier 800 may be a current amplifier for quasi-static capacitance measurements or resistive measurement.

Scanning of capacitive sensor array 300 is based on differential capacitance measurements of pairs of intersecting top electrodes 112 and bottom electrodes 212. Since the top electrodes 112 and the bottom electrodes 212 are separated by the spacers 10 or gasket 20, the system of the present application allows 3D image sensing across the top electrode plate 100 and the top electrode plate 200. In addition, by measuring differential capacitance among pairs of intersecting top electrodes 112 and bottom electrodes 212, it also eliminates the effect of the parasitic capacitance.

The processor 700 analyzes the data acquired from the capacitive sensor array 300. Based on the differential capacitance values, the processor 700 constructs movement images of the DSA pattern.

Figure 10:
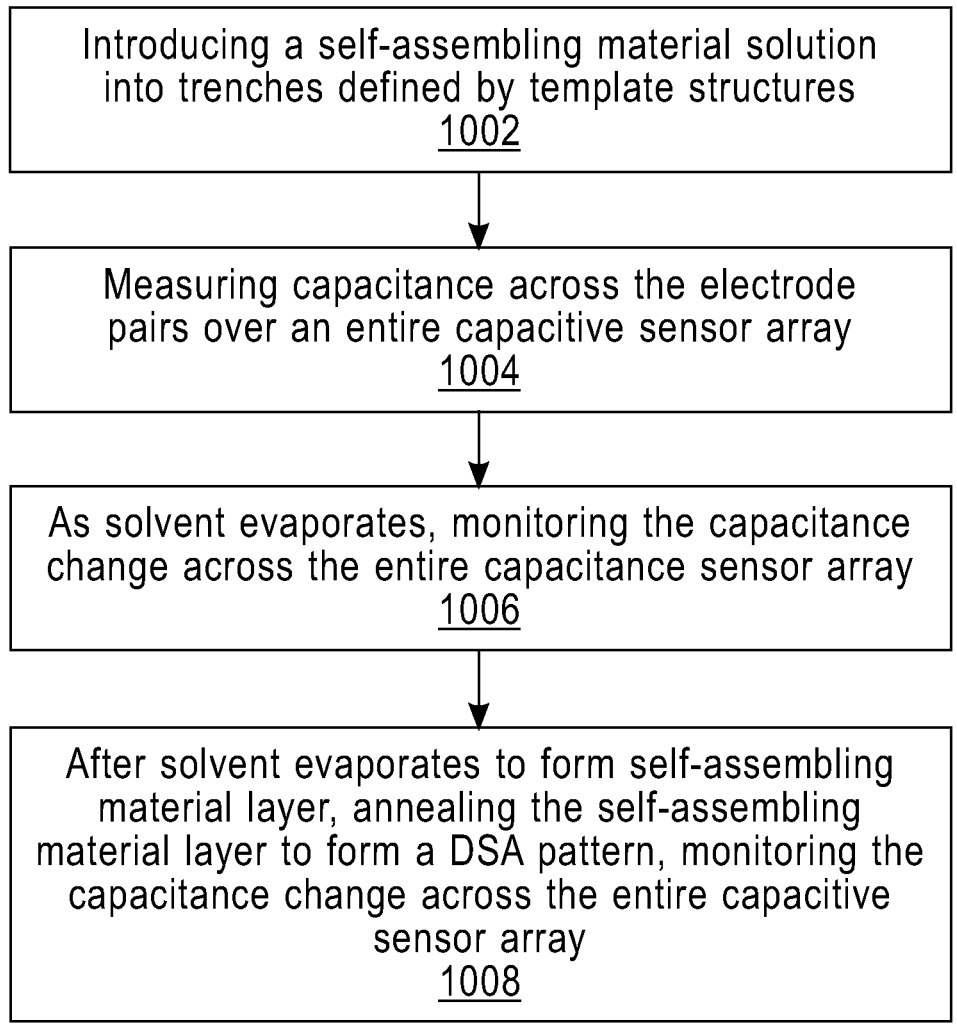
FIG. 10 is a flowchart illustrating a measurement process using the capacitive sensor array of the present application to monitor DSA of a self-assembling material.

FIG. 10 is a flowchart illustrating a measurement process using the exemplary capacitive sensor array 300, 300' of the present application to monitor DSA pattern formation of a self-assembling material. In step 1002, a solution of a self-assembling material is introduced into trenches 232 that are defined by template structures 230. In one embodiment, the self-assembling material solution can be introduced into the trenches 232 from ends of the trenches 232. In another embodiment, the self-assembling material solution can be introduced into the trenches 232 via through holes 30 under vacuum. The self-assembling material solution can be introduced by flowing the solution into one through hole 30 and flow out from another through hole 30. Alternatively, the self-assembling material solution can be introduced by subjecting the through holes 30 to a vacuum followed by backfilling the through holes 30 with the solution. In yet another embodiment, the self-assembling material solution can be introduced into trenches 232 before the top electrode plate 100 is assembled to the bottom electrode plate 200. In step 1004, capacitance across the electrode pairs over the entire capacitive sensor array 300, 300' is measured. The capacitance can be measured between neighboring electrodes in the same electrode plate (e.g., either the top electrode plate 100 or the bottom electrode plate 200) or between intersecting top and bottom electrodes 112, 212 in the top electrode plate 100 and the bottom electrode plate 200. In step 1006, as the solvent in the self-assembling material solution evaporates, the capacitance change across the capacitive sensor array 300, 300' is monitored. By recording the capacitance of electrode pairs over time, a 2D map of the capacitance of the entire capacitive sensor array 300, 300' can be generated. Any capacitance change between electrode pairs indicates formation of self-assembled structures during the solvent drying process. In step 1008, after the solvent is evaporated to form a self-assembling material layer, the self-assembling material layer is annealed by subjecting the bottom substrate 210 to any suitable heat treatment. The capacitance of the electrode pairs of the entire capacitive sensor array 300, 300' is recorded over time. In one embodiment and for example, the formation and dynamics of a DSA pattern (e.g. a lamella structure) can be obtained from the capacitance changes between the electrode pairs at different locations. The shape, size and other features such as, for example, periodicity of the lamellae, the degree of roughness or smoothness of the lamellae interface which are important parameters for the application of DSA at wafer scale in the semiconductor chip manufacturing industry can also be obtained using the geometry of the capacitive sensor array of the present application as an input parameter. It will also show if any structural defects or disclinations develop during the DSA process, the capacitive sensor array of the present application provides a unique approach to locate and monitor the evolution of such defects. In addition, the capacitive sensor array of the present application provides a unique way to investigate the self-assembling properties of new block copolymers in-situ instead of the post-DSA characterization of the currently employed electron microscopic and atomic force microscopic techniques.

In the present application, by forming a capacitive sensor array with built-in template structures for guiding or confining DSA of a self-assembling material, the DSA pattern formation of the self-assembling material can be in-situ monitored via measuring the differential capacitance change. In addition, by varying inter-electrode spaces of the capacitive sensor array, a wide range of length-scales of DSA pattern formation can be monitored, measured and mapped. The data generated can be used to optimize the DSA pattern formation process.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A capacitive sensor array comprising:
    a bottom electrode plate comprising a plurality of bottom electrodes that are spaced apart and electrically isolated from one another;
    a plurality of spaced apart template structures located on, and permanently affixed to, the bottom electrode plate and covering some of the bottom electrodes of the plurality of electrodes, wherein a spacing between each neighboring pair of template structures of the plurality of spaced apart template structures define trenches in which self-assembly of a self-assembling material occurs, each of the trenches exposing at least one of the plurality of bottom electrodes not covered by one of the template structures, and wherein each spaced apart template structure of the plurality of spaced apart template structure is composed of a material that can be preferentially wetted by one type of a self-assembling domain of the self-assembling material so as to induce or confine direct self-assembly of the self-assembling material in the trenches; and
    a top electrode plate assembled above the bottom electrode plate and the plurality of spaced apart template structures, wherein the top electrode plate comprises a plurality of top electrodes that are spaced apart and electrically isolated from one another, the top electrodes facing the bottom electrodes, but electrically isolated from the bottom electrodes and the spaced apart template structures by a gap.

2. The capacitive sensor array of claim 1, wherein the template structures guide directed self-assembly (DSA) pattern formation.

3. The capacitive sensor array of claim 1, wherein the bottom electrode plate further comprises a bottom substrate, wherein the plurality of bottom electrodes is located on or embedded within the bottom substrate.

4. The capacitive sensor array of claim 1, wherein the top electrode plate further comprises a top substrate, wherein the plurality of top electrodes is located on or embedded within the top substrate.

5. The capacitive sensor array of claim 4, wherein the top substrate further comprises through holes extending through the top substrate.

6. The capacitive sensor array of claim 1, wherein the top electrode plate is separated from the bottom electrode plate by spacers.

7. The capacitive sensor array of claim 1, wherein the top electrode plate is separated from the bottom electrode plate by a gasket.

8. The capacitive sensor array of claim 1, wherein a distance between the top electrode plate and the bottom electrode plate is from 1 nm to 1 cm.

9. The capacitive sensor array of claim 1, wherein the plurality of bottom electrodes is a plurality of conductive lines arranged in parallel along a first direction, and the plurality of top electrodes is a plurality of conductive lines arranged in parallel along a second direction that is perpendicular to the first direction.

10. The capacitive sensor array of claim 9, wherein a width of each of the plurality of bottom electrodes and the plurality of top electrode is from 1 nm to 1 cm.

11. The capacitive sensor array of claim 1, wherein the plurality of bottom electrodes is a plurality of conductive lines, and the plurality of top electrodes is a plurality of conductive pads.

12. The capacitive sensor array of claim 1, wherein the bottom electrode plate further comprises bottom terminal pads located on opposite ends of each of the plurality of bottom electrodes.

13. The capacitive sensor array of claim 1, wherein the top electrode plate further comprises a top terminal pad located on one end of each of the plurality of top electrodes.

14. The capacitive sensor array of claim 1, wherein the material of each spaced apart template structure of the plurality of spaced apart template structure is hydrogen silsesquioxane (HSQ).

15. The capacitive sensor array of claim 1, wherein the material of each spaced apart template structure of the plurality of spaced apart template structure is methyl silsesquioxane (MSQ).

* * * * *